United States Patent
Tam

(10) Patent No.: US 6,628,146 B2
(45) Date of Patent: Sep. 30, 2003

(54) COMPARATOR CIRCUIT AND METHOD

(75) Inventor: Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/199,102

(22) Filed: Jul. 22, 2002

(65) Prior Publication Data

US 2003/0016060 A1 Jan. 23, 2003

(30) Foreign Application Priority Data

Jul. 23, 2001 (GB) .............................................. 0117906

(51) Int. Cl.$^7$ ............................ H03K 5/22; H03K 5/153
(52) U.S. Cl. ............................ 327/63; 327/74; 327/77; 327/82
(58) Field of Search ............................ 327/59, 60, 72, 327/73, 77–82, 337, 63

(56) References Cited

U.S. PATENT DOCUMENTS

| | | | |
|---|---|---|---|
| 3,676,702 A | 7/1972 | McGrogan, Jr. ............. | 327/68 |
| 4,191,900 A | 3/1980 | Redfern et al. ............. | 365/15 |
| 4,237,390 A | * 12/1980 | Buurma ........................ | 327/77 |
| 4,547,683 A | 10/1985 | Bingham ........................ | 327/3 |
| 5,010,338 A | * 4/1991 | Miki et al. ................... | 341/159 |
| 5,113,091 A | * 5/1992 | Hsu et al. ..................... | 327/82 |
| 5,170,155 A | 12/1992 | Plus et al. ................... | 345/100 |
| 5,949,270 A | 9/1999 | Saito ........................... | 327/390 |

\* cited by examiner

*Primary Examiner*—Tuan T. Lam
(74) *Attorney, Agent, or Firm*—Oliff & Berridge, PLC

(57) ABSTRACT

An apparatus and method for comparing two input voltages. The apparatus being a comparator circuit comprising a pair of series connected polycrystalline transistors, two capacitors and a switch, the switch being connected between the point of series connection of the transistors and a node to which one side of each capacitor and the gates of the transistors are connected in common, with the other side of each capacitor being operably connected to a respective input. The method comprising: providing a comparator having a pair of series connected polycrystalline transistors, two capacitors and a switch, the switch being connected between the point of series connection of the transistors and a node to which one side of each capacitor and the gates of the transistors are connected in common, closing the switch to transfer a bias voltage to the node, storing the bias voltage on the capacitors, opening the switch, applying each input voltage to a respective one of the capacitors, and detecting any resultant change in the bias voltage.

14 Claims, 7 Drawing Sheets

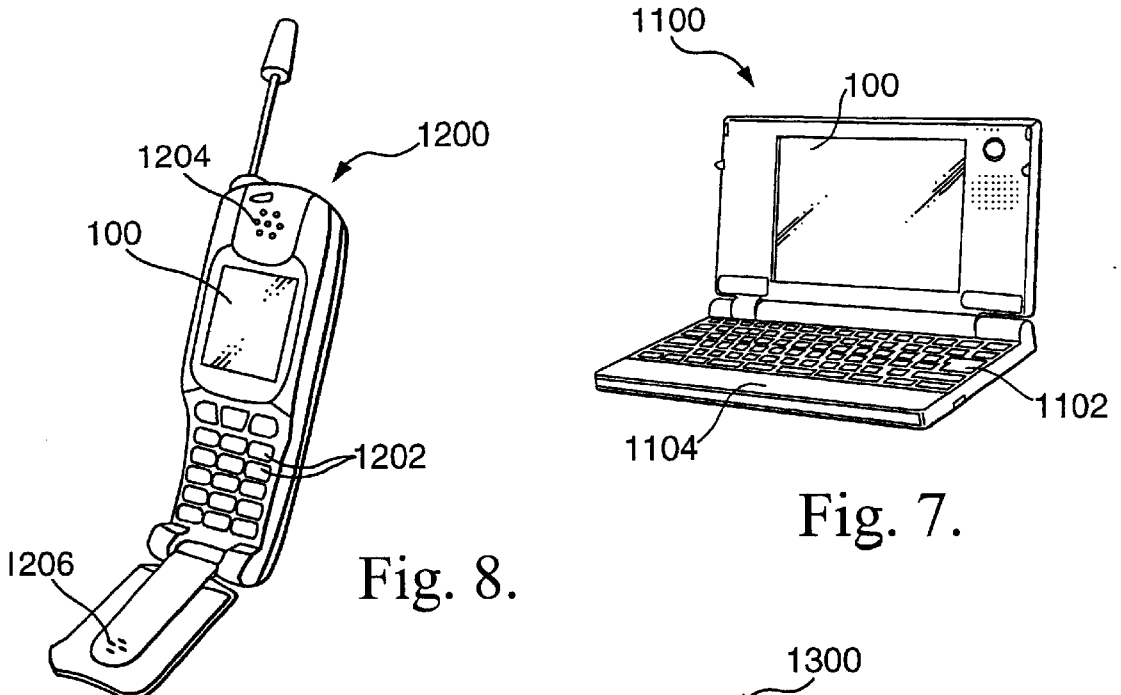
Fig. 8.
Fig. 7.
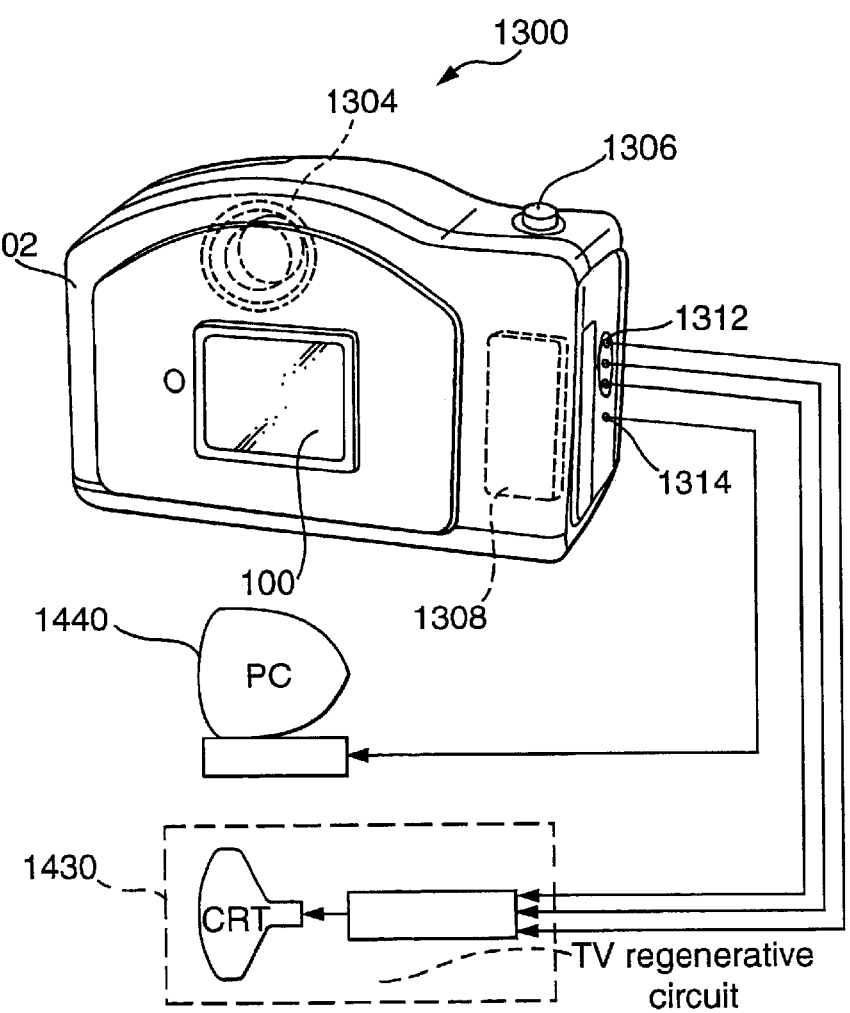
Fig. 9.

COMPARATOR CIRCUIT AND METHOD

The present invention relates to a comparator circuit and method. Such circuits and methods are, of course, already known. However, the known circuits and methods exhibit a number of disadvantages and the object of the present invention is to provide an improved comparator circuit and method.

A very substantial difficulty experienced in transistor implemented comparator circuits is the variation in threshold voltage which occurs between different transistors. This problem was encountered in the 1970s and techniques were devised to mitigate the effect of the non-uniformity of the threshold voltage. At that time, of course, the transistor fabrication was nMOS and subsequent improvements in the fabrication process for single crystal devices was such that no further attention was paid to the threshold variation problem. Recently this position has changed, particularly as a consequence of tie reduction in size of nMOS devices to the sub-micron level.

An example of a recent technique to compensate for threshold voltage variation in a single crystal transistor implemented comparator circuit is disclosed in U.S. Pat. No. 5,949,270 issued on Sep. 7, 1999. As disclosed in that document, a capacitor is connected between the gate of a transistor that is an object of threshold voltage compensation and an input terminal. A first switching device is connected between a current source connected to one term of the transistor and the gate of the transistor. A second switching device is connected between the input terminal and a terminal to which a reference voltage is applied. The first switching device is turned ON so that the transistor is diode-connected, The second switching device is turned ON, thus applying the reference voltage to the input terminal. A reference voltage is applied to a current inflow terminal connected to another terminal of the transistor. After charge dependent on the threshold voltage of the transistor is accumulated in the capacitor, the first switching device is turned OFF. With this control, a difference in threshold voltages between adjoining transistors can be compensated for.

Thin film transistors (TFTs), which are formed using a polycrystalline semiconductor film, such as polycrystalline silicon, are well known. Such polysilicon TFTs arc considered to have several advantages over MOS devices formed with a single crystal semiconductor. Principally, TFTs can be produced relatively inexpensively since the fabrication process avoids the constraints of producing a sufficiently large single crystal silicon substrate with a satisfactorily low level of impurities. Moreover, because the polycrystalline semiconductor film can be produced on any suitable supporting substrate, such as glass sheet, the size constraints necessitated by the production of a single crystal substrate are obviated, so that large numbers of TFTs, and hence a large number of circuits, can be produced on a relatively inexpensive single support substrate.

However, polysilicon TFTs have the significant drawback in that they have widely varying threshold voltages, even when manufactured in the same production batch and using the same polysilicon film. The threshold voltage is effectively the voltage which must be applied to the gate electrode of the TFT to enable a current to flow in the channel region between the source and drain regions and so determine the ON-condition of the TFT. In the fabrication process for the polysilicon film it is difficult to guarantee continuity of individual crystal sizes and, furthermore, there are also variations in the purity of the film. Thus, the polysilicon film material varies between the TFTs fabricated from a common polysilicon film and it is this film material which determines the threshold voltage of the TFTs. Hence, polysilicon TFTs exhibit a far greater variation in threshold voltage in comparison to MOS single crystal transistors. As a consequence of this variation in threshold voltage. TFTs have not been considered for many circuit applications, and in particular for those applications where consistency of transistor threshold voltage is of paramount importance, such as comparator circuits. This is because for such circuits to be of practical use in comparing the levels of signals applied to the circuit input terminals, a small difference occurring between the voltage level applied to one input terminal and the voltage level applied to another input terminal of the comparator is required to produce a large change in the voltage at the output terminal. If there is a significant difference between the threshold voltage of one transistor used to detect these levels and the threshold voltage of another transistor used to detect the levels, the difference between the voltages applied to the input terminals must exceed the difference in the threshold voltages between the transistors for any voltage to be provided at the output terminal. TFTs exhibit this variation in the threshold voltage which has severely hindered their use in comparator circuits.

Moreover, for TFTs, the current/voltage characteristic varies with the width/length ratio of the channel region. Additionally, for any channel region width/length ratio, the operational characteristic differs significantly between P and N channel devices. For example, for any change in voltage applied to the device, an N channel TFT will exhibit a much shaper rise in output current than for a P-channel TFT.

Several concerns also exist with the threshold compensation circuit as described in U.S. Pat. No. 5,949,270, such that it would not reliably function if implemented using TFTs.

The first switching device described in U.S. Pat. No. 5,949,270 is a MOS transistor connected as a diode which, in essence, acts as a load resistor for the second switching device. As it is a transistor connected to operate as a diode it will exhibit a non-linear impedance characteristic.

For comparator circuits, a prime requirement is to make the swing in the voltage at the output terminal as large as possible for any change between the voltages at the input terminals.

From FIG. 1, which shows the transfer characteristic of an inverter circuit implemented using TFTs, it can be seen that if such a circuit is used as a comparator it is necessary to operate the TFTs on the knee portions of the characteristic so as to ensure that there is a large swing in the output voltage for a small change in the input voltage. The non-linear characteristic of the first switching device of U.S. Pat. No. 5,949,270 coupled as a diode would not enable this to be achieved reliably in practice.

Furthermore, the circuit described in U.S. Pat. No. 5,949, 270 is implemented using a pair of N-channel switching devices. Therefore, when the circuit is in operation both devices are ON at all times, creating high power consumption. Hence, it is not a straightforward step to implement the circuit shown in U.S. Pat. No. 5,949,270 using TFTs, and in particular using complementary TFTs so as to minimise power consumption in use of the circuit.

According to a first aspect of the present invention there is provided a comparator circuit comprising a pair of complementary thin film transistors serially coupled to provide an inverter and two capacitors, one side of each capacitor being operably coupled to a respective input terminal and the other side of each capacitor being connected in common to a node coupled to the gates of the transistors, and further comprising a switch coupled to the node, which is arranged to provide a voltage from the point of series connection of the transistors for storage in the capacitors to act as a bias voltage for voltages applied to the input terminals and thereby compensate any threshold voltage variation between the thin film transistors.

In addition to the differences in circuit arrangement between the first aspect of the present invention and the circuit described in U.S. Pat. No. 5,949,270, it will also be appreciated that the present invention uses polycrystalline thin film transistors rather than the single crystal transistors used in all of the prior art discussed above.

Preferably the comparator circuit according to the present invention comprises two further switches each selectively connecting a respective said other side of said capacitors between ground and the said respective input. Beneficially the switches are implemented by transistors. Very desirably all of the transistors are CMOS TFT transistors.

It is preferred that the comparator circuit of the present invention further comprises an output stage with said output stage being selectively isolated or connected to said transistor pair by an output stage switch. Furthermore, it is preferred that a buffer is connected between the output stage switch and the said transistor pair.

According to a second aspect of the present invention there is provided a method of comparing two input voltages by: providing a comparator having a pair of complementary thin film transistors serially coupled to provide an inverter, and two capacitors, operably coupling one side of each capacitor to a respective input terminal and connecting in common the other side of each capacitor to a node coupled to the gates of the transistors, and further providing a switch coupled to the node, closing the switch to transfer a bias voltage to the node, storing the bias voltage on the capacitors so as to compensate any threshold voltage variation between the thin film transistors, opening the switch, applying each input voltage to a respective one of the capacitors, and detecting any resultant change in the bias voltage.

Embodiments of the present invention will now be described by way of further example only and with reference to the accompanying drawings in which:

FIG. 1 illustrates the effect of threshold voltage variation on the transfer characteristic of an inverter, FIG. 2 shows a self-biased TFT CMOS comparator in accordance with an embodiment of the present invention, FIG. 3 shows a detailed implementation of the circuit of FIG. 2, FIG. 4 shows the driving waveform, the input waveforms and the output waveform of one particular embodiment of the present invention;

FIG. 7 is a schematic view of a mobile personal computer including a display device incorporating a comparator circuit in accordance with the present invention;

FIG. 8 is a schematic view of a mobile telephone including a display device incorporating a comparator circuit in accordance with the present invention; and FIG. 9 is a schematic view of a digital camera including a display device incorporating a comparator circuit in accordance with the present invention.

Whereas all of the known prior proposals have been based on the use of single crystal nMOS transistors, the present invention is based on the use of polycrystalline thin film transistors. Not only is it not straight forward to substitute polycrystalline transistors for the single crystal transistors in the known proposals, but also to adopt polycrystalline transistors would appear to be illogical since it is well known that the threshold voltage variation problem is far more severe in polycrystalline transistors than in single crystal transistors. However, the present invention enables this very significant disadvantage to be overcome by providing a comparator which is independent of threshold voltage variation of the TFTs. This enables the significant advantages of TFT CMOS circuitry to be realised in the comparator circuitry. The advantages include the relative ease with which polycrystalline transistors can be fabricated compared with the fabrication of single crystal devices and also the much lower power consumption required by polycrystalline circuits. It also enables the comparator circuits to be fabricated in a common process step with other TFT circuits in devices for which TFT circuits have already found widespread application, such as active matrix addressing schemes for electrooptical display devices.

Figure 1:
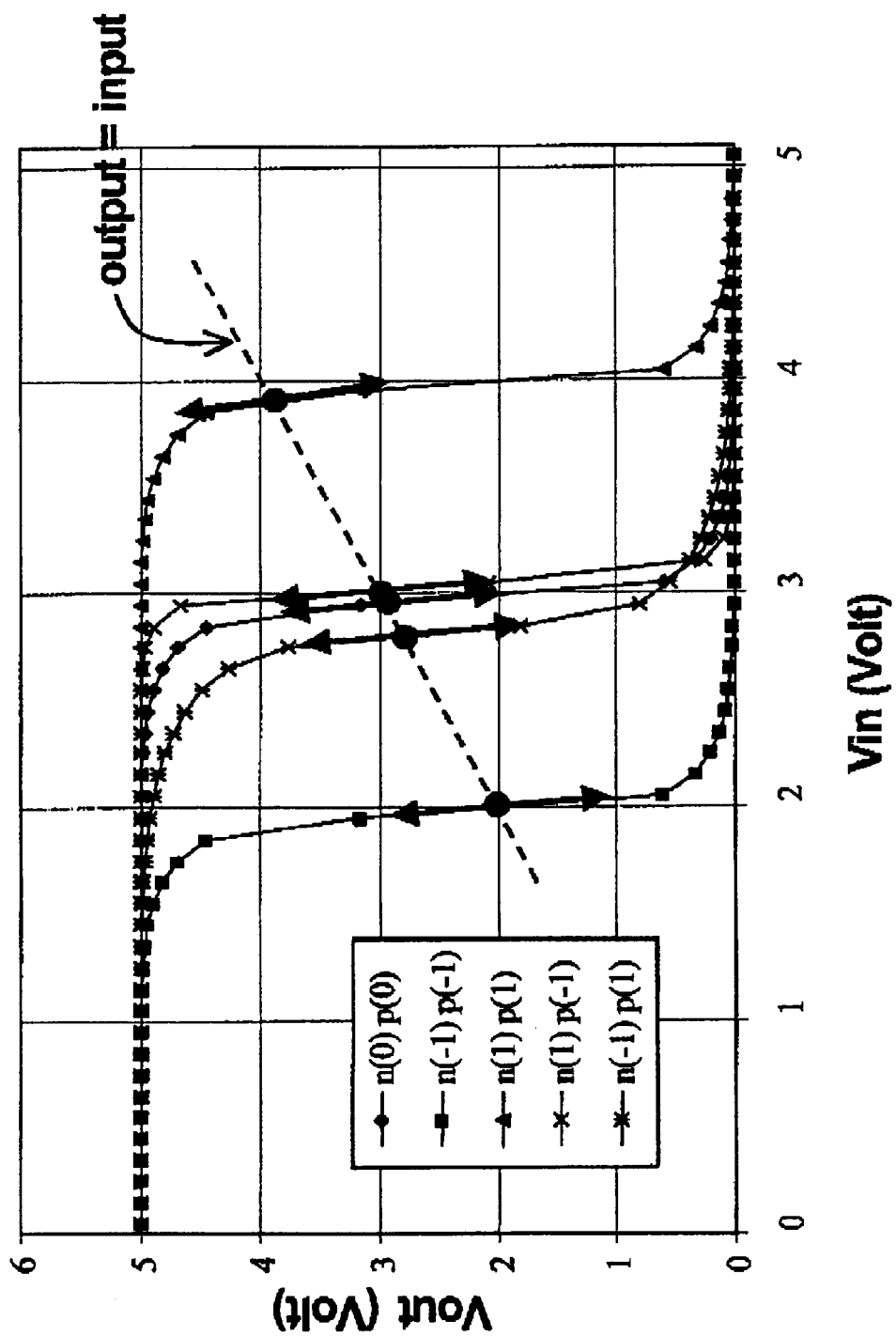

The threshold voltage variation difficulties usually encountered with polycrystalline transistors can be readily appreciated by considering the transfer characteristics of an N and P pair of such transistors, for example the transfer characteristics of a TFT inverter circuit. FIG. 1 illustrates the variation in the transfer characteristic of a TFT inverter circuit when different threshold voltage variations exist between the two transistors. Typically the threshold voltage variation between polycrystalline transistors typically is approximately ±1V.

FIG. 1 illustrates examples of possible combinations of threshold voltage variations; n(0) p(0), n(−1) p(−1), n(1) p(1), n(1) p(−1), n(−1) p(1), where n and p respectively denote the N and P type transistors and 0, 1 and −1 represent the threshold voltage variation (in volts) from an ideal (i.e. n(0) p(0)). As can be seen, the input voltage at which a significant change occurs in the output logic/voltage varies between approximately 2V and just under 4V. The consequence of this is that with the simple implementation of a TFT CMOS comparator the minimum voltage difference which can be distinguished reliably between two input voltages being compared is approximately 2V. This has precluded their use in comparator circuits.

Figure 2:
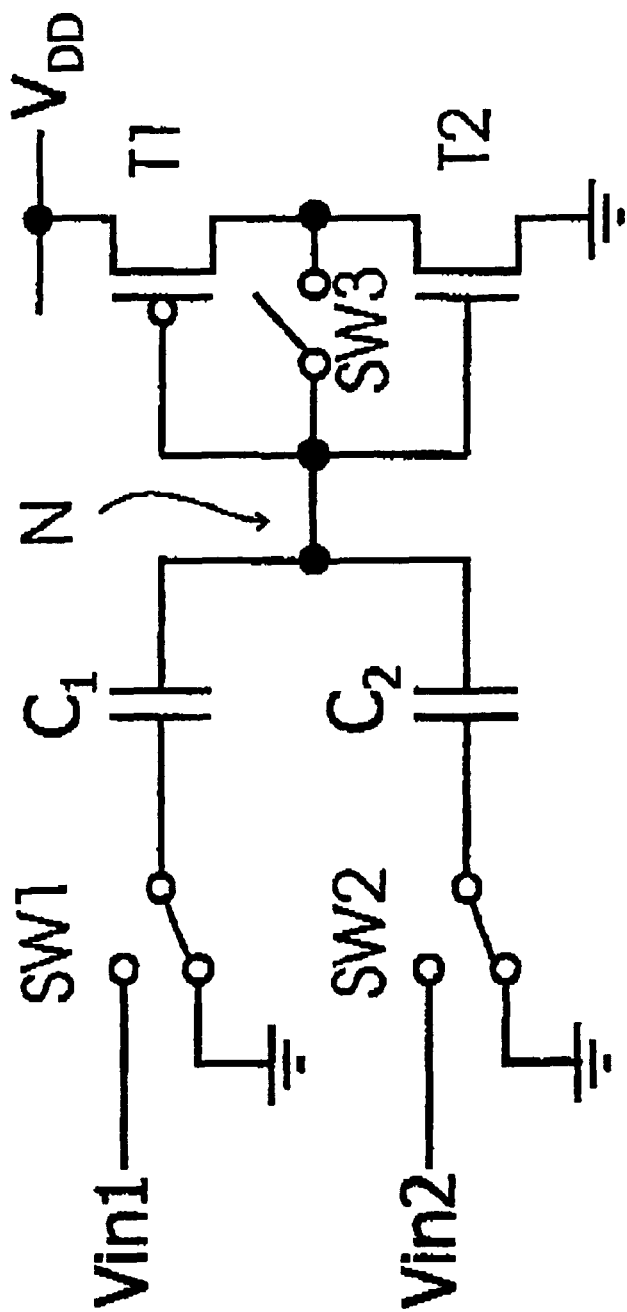

The principle of the circuit used by the present invention will be explained with reference to FIG. 2. FIG. 2 shows a self-biased TFT CMOS comparator in which a TFT complementary N/P pair, T1 and T2, are series connected between supply rails and in which the inputs, Vin1 and Vin2, for the voltages to be compared are connected via respective select switches, SW1 and SW2, to one side of respective capacitors, $C_1$ and $C_2$. Ideally, the value of capacitor $C_1$ is equal to the value of capacitor $C_2$. The other sides of the capacitors are connected in common, at node N, to a common connection between the gates of the two transistors T1 and T2. A switch SW3 is connected between the common connection of the gates and the point of series connection between the two transistors.

One method for operating the circuit of FIG. 2 is as follows. Starting from the position shown in FIG. 2, that is with switch SW3 open and switches SW1 and SW2 connecting the capacitors $C_1$ and $C_2$ to ground, close switch SW3. The voltage (the bias voltage) from the series connection point of the transistors T1 and T2 is thus transferred to node N and capacitors $C_1$ and $C_2$ are charged to this voltage. Switch SW3 is then opened and the bias voltage is maintained by the capacitors and the voltage at node N floats at the level of the voltage stored in capacitors $C_1$ and $C_2$. The bias voltage can therefore now be used as a point of toggle voltage in the comparison of the voltages respectively input on Vin1 and Vin2. Next, switches SW1 and SW2 are operated to connect Vin1 and Vin2, respectively, to capacitors $C_1$ and $C_2$. The input voltages are thus transferred across the capacitors. If Vin1 and Vin2 are equal, the node N stays at the bias voltage level. However, if Vin1 is not equal to Vin2 then the voltage at node N will vary upwards or downwards, depending on which is the larger of the two input voltages. Hence, any difference between the input voltages appears as a change in the value of the bias voltage at the node N. Thus, the circuit of FIG. 2 is capable of detecting relatively small differences between the input voltages, because that difference results in a directly corresponding change in the bias voltage at node N. Input voltage differences of 0.5V or less can be detected very easily using this arrangement. The resolution of the comparator is therefore readily improved from the ±2V explained above to better than ±0.5V. This improvement in resolution is governed by the slope of the transfer characteristic of the transistors, as shown in FIG. 1. This slope is in turn governed by the width to length ratio (W/L) of the channel regions of the transistors T1 and T2. The resolution cam therefore be further improved by optmising the dimensions of transistors T1 and T2. Moreover, it will be apparent that the circuit of FIG. 2 is effectively independent of transistor threshold voltage variation.

As a result of improving the sensitivity of the circuit, the power supply requirement can be reduced. The benefits of the low power consumption usually associated with CMOS technology can thus be realised.

A further and very significant advantage deriving from the circuit of FIG. 2 is a substantial improvement in the ease of fabrication. That is, it is very much easier to manufacture matched pairs of capacitors than it is to manufacture pairs of thin film transistors having matched characteristics. Thus, a good comparator function can be obtained even though significant threshold voltage variations (typically −1 V or +1 V for both n-channel and p-channel TFTs) exist between the TFTs.

Furthermore, the matched as of capacitors $C_1$ and $C_2$ can be implemented using a Metal Insulator −N+ structure or a Metal Insulator −P+ structure and the process for fabricating such structures is compatible with the TFT fabrication process, simplifying overall circuit fabrication and printing significant manufacturing cost benefits.

Comparator circuits are in widespread use for applying drive signals to the pixels of a matrix addressed display device and such devices will include typically many hundreds of comparator circuits. The preferred form of addressing scheme for such devices is an active matrix address scheme, particularly for the larger sizes of display device which increasingly are being used in many forms of electrical equipment, such as laptop computers. The active matrix schemes provide improved uniformity of displayed image but necessitate the use of individual transistors located at each pixel of the display. Because the transistors are required to be physically located over a wide area, TFTs are used for such addressing schemes. However, because it has not been possible to provide reliable comparator circuits using TFTs in view of the variations in operational characteristics, it has been necessary to provide the comparators using single crystal transistor devices. The fabrication process for single crystal devices is totally incompatible with that for TFTs and thus the comparator circuits have been provided as encapsulated circuits which are manufactured separately and then usually mounted at the frame areas of the display. The necessity to use encapsulated circuits adds significantly to the display fabrication costs and also increases the physical size of the display device. Hence, the ability to provide comparator circuits using TFTs brings significant benefits because the circuits can be fabricated on a common substrate with the active matrix addressing scheme and using a common fabrication process. This is achieved with the present invention because the hitherto significant problem of TFT threshold voltage variation precluding the use of such devices in comparator circuits having sufficient sensitivity to reliably detect the required small differences between the comparator input signal voltage levels is negated by the self biasing of the voltage at the gate electrodes of the TFTs. Hence, the present invention has enabled TFT to be used in such circuits and has enabled these circuits to be fabricated at lower cost and more efficiently for a wide variety of practical applications than has hitherto been possible. This is a surprising benefit when considering that, using standard fabrication statistics, TFTs have typically a threshold voltage variation of ±1V which has historically rendered the devices unusable for the operation of inverters and, in particular, comparators.

Figure 3:
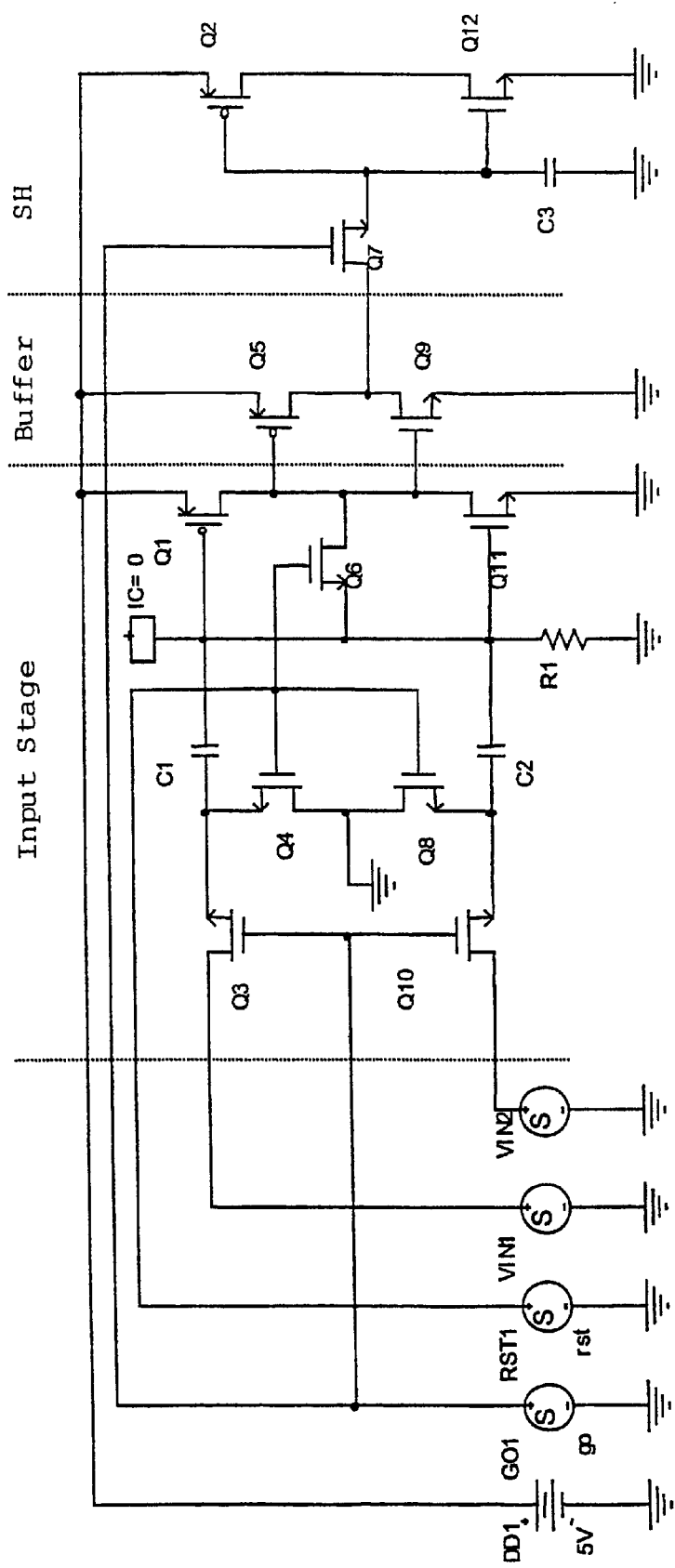

A detailed implementation of the circuit of FIG. 2 is shown in FIG. 3. Capacitors $C_1$ and $C_2$ retain the same reference numerals. Transistors T1 and T2 will be recognised as Q1 and Q11. Switches SW1, SW2 and SW3 will be recognised in their implementation by transistors Q3, Q10 and Q6, respectively. A transistor pair Q4 and Q8 are series connected between the switch plate sides of $C_1$ and $C_2$, with their point of series connection being stabilised at ground. Thus, the circuit is reset by applying a reset signal RST1 to the gates of transistors Q4, Q6 and Q8. A start signal, GO1, is applied to the gates of transistors Q3 and Q10; so as operate the switches SW1 and SW2.

A buffer, comprising the transistor pair Q5 and Q9 series connected between the supply rails, is connected to the output of the above described input stage. The buffer is connected to the output stage (transistors Q2 and Q12, and capacitor C3) via transistor Q7. Transistor Q7 (whose gate receives signal GO1) acts as a switch to keep the output switched off until the input stage has had tine to self-bias. Transistor Q7 may conveniently be referred to as an output stage switch.

Figure 4:
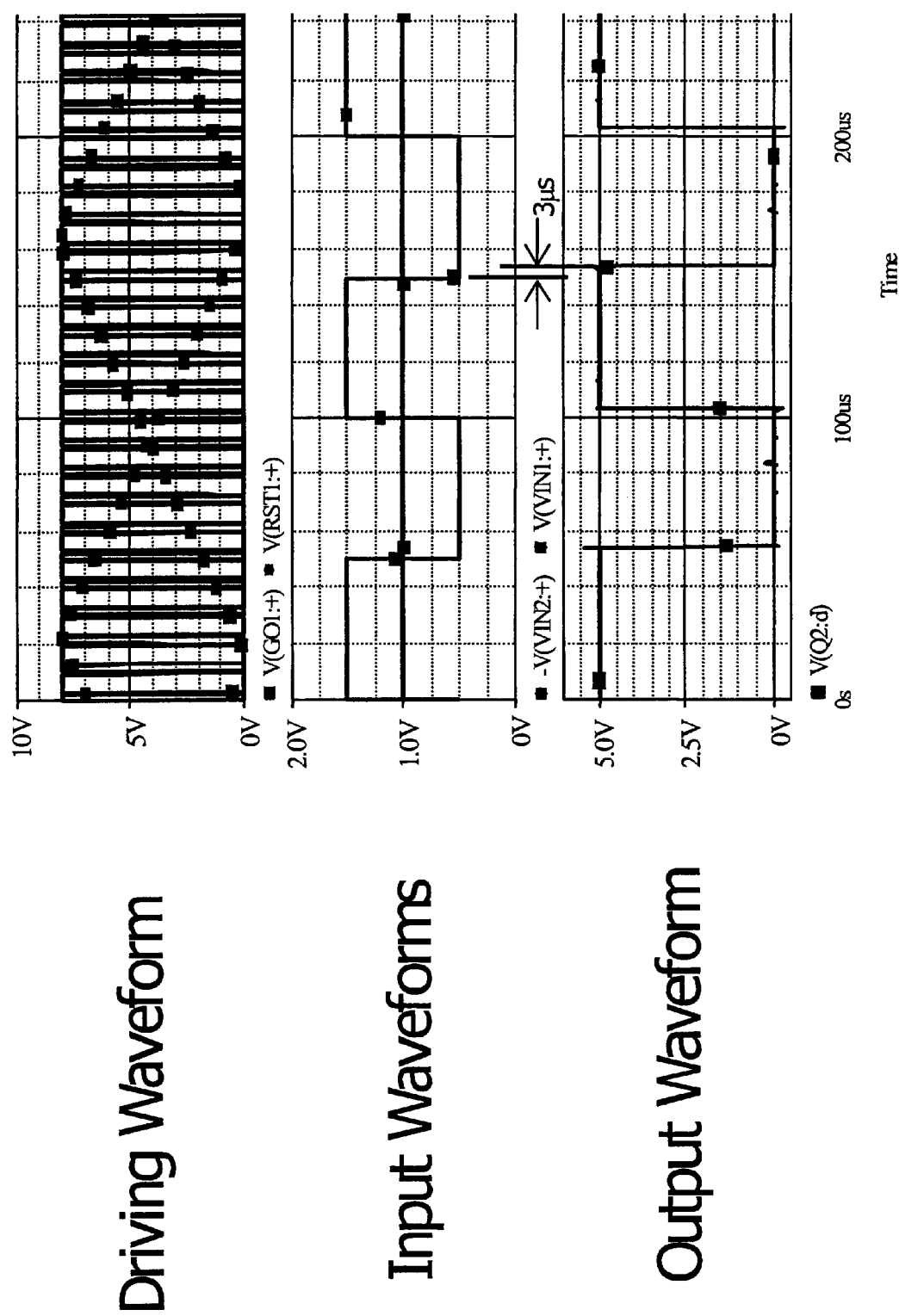
Figure 5:
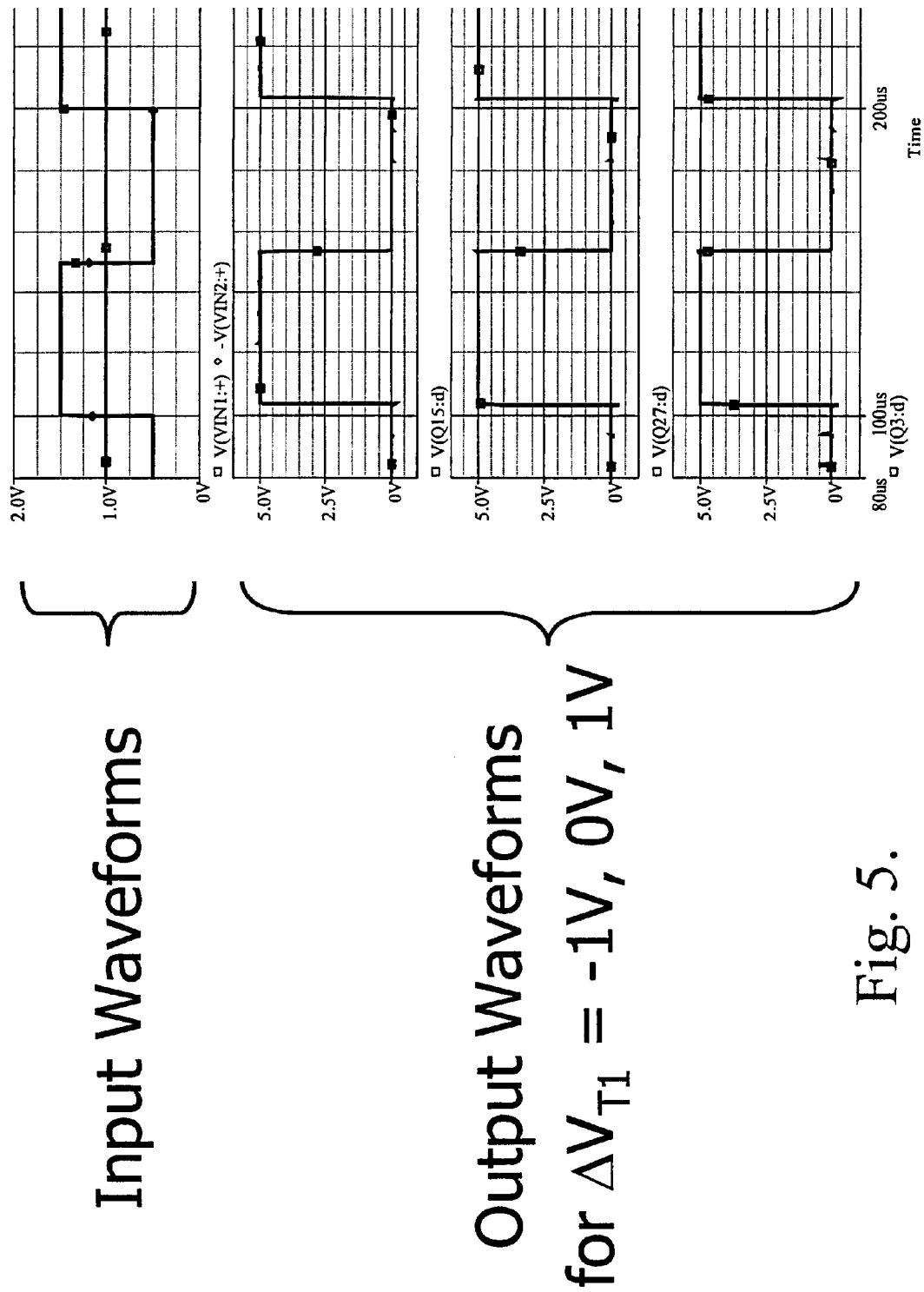
FIG. 5 shows input waveforms and corresponding output waveforms for certain threshold voltage variations of one particular embodiment of the present invention.

The results achieved with an embodiment of the circuit of FIG. 3 are illustrated in FIGS. 4 and 5. FIG. 4 shows the driving waveform, the input waveforms and the output waveform of one particular embodiment. FIG. 5 illustrates input waveforms and corresponding output waveforms for threshold voltage variations in T1 of −1V, 0V and 1V (effectively the variation of voltage on Q6).

Figure 6:
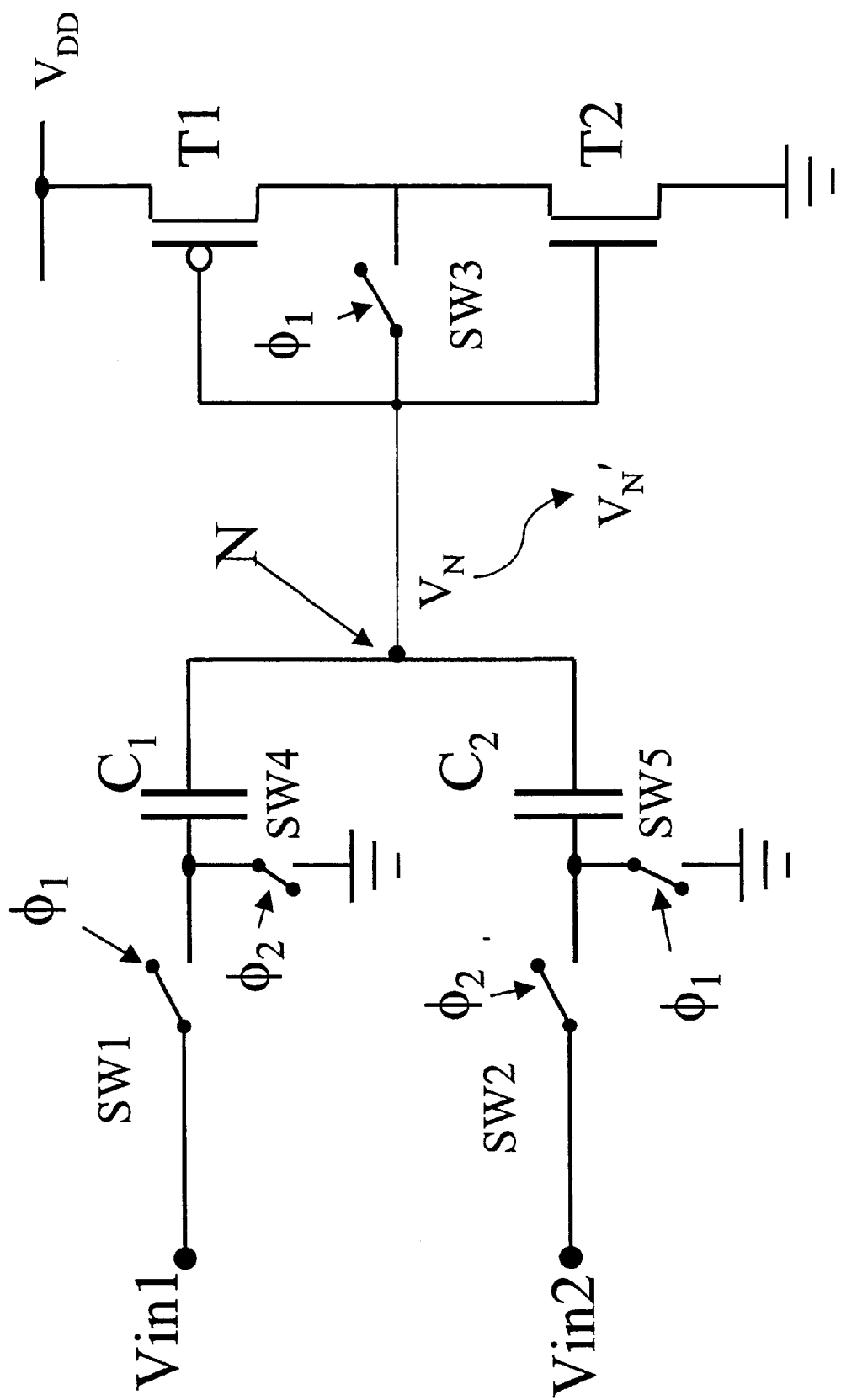
FIG. 6 shows an alternative method for operation of the circuit illustrated in FIG. 2.

An alternative method for operating the comparator circuit of the present invention will now be described with reference to FIG. 6.

In the method illustrated with reference to FIG. 6, switches SW1, SW3 and SW5 are operated in unison by a clock pulse $\phi_1$ and switches SW2 and SW4 are operated by a clock pulse $\phi_2$. The clock pulses $\phi_1$ and $\phi_2$ are non-overlapping clock pulses and thus, when the switches SW1, SW3 and SW5 are 'open', the switches SW2 and SW4 are 'closed'; and vice versa. Therefore, at start up with the switches SW1 and SW3 closed, the bias voltage at node N, shown as $V_N$ in FIG. 6, is applied to one side of capacitor $C_1$. However, the other side of capacitor $C_1$ is connected to $V_{in}1$ because the switch SW1 is closed and the switch SW4 is open. The voltage stored across capacitor $C_1$ is therefore $V_N - V_{in}1$.

With regard to capacitor $C_2$, the switch SW2 is closed and the switch SW4 is open so one side of capacitor $C_2$ is connected to ground and the other side of the capacitor is coupled to the node N, which is at the voltage $V_N$. Thus, the voltage $V_N$ is stored across the capacitor $C_2$.

The switches SW1, SW3 and SW5 are then opened and the switches SW2 and SW4 are closed to apply the voltage $V_{in}2$ to one side of capacitor C2. If the charge in capacitor $C_1$ is considered to be $Q_1$ and the charge on capacitor $C_2$ is considered to be $Q_2$, these charges can be expressed as follows $$\phi_1 : Q_1 = (V_N - V_{in}1)C_1 + V_N C_2$$

$$\phi_2 : Q_2 = V_N C_1 + (V_N - V_{in}2)C_2$$

The capacitors $C_1$ and $C_2$ preferably have equal capacitance so if the voltages $V_{in}1$ and $V_{in}2$ are equal, there will be charge balance between the two capacitors, i.e. $Q_1=Q_2$.

When the switch SW2 is closed to apply the voltage $V_{in}2$ to the capacitor $C_2$ the voltage $V_N$ at the node N will drift to a new value $V_N'$ and this can be expressed as $$V_N' = V_N + 0.5(V_{in}2 - V_{in}1)$$

Therefore, in this embodiment of the invention, the input voltages $V_{in}1$ and $V_{in}2$ can be of the same polarity; either positive or negative voltages. This simplifies overall circuit design as it is not necessary to provide input voltages of opposite polarity.

The present invention may be used in displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electrooptical device or display in which a comparator circuit according to the present invention is (are) applied as noted above can be incorporated in the many types of equipment, and these can readily be provided even when a plastic substrate is used.

Various electronic apparatuses using such electrooptical display devices will now be described.

<1: Mobile Computer>

An example in which the display device incorporating the present invention is applied to a mobile personal computer will now be described.

FIG. 7 is an isometric view illustrating tile configuration of this personal computer. In the drawing, the personal computer 1100 is provided with a body 1104 including a keyboard 1102 and a display unit 1106. The display unit 1106 is implemented using a display panel fabricated according to the present invention, as described above.

<2: Portable Phone >

Next, an example in which the display device is applied to a display section of a portable phone will be described. FIG. 8 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device according to the present invention, as described above.

<3: Digital Still Camera>

Next, a digital still camera using an OEL display device as a finder will be described. FIG. 9 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 7, the portable phone shown in FIG. 8, and the digital still camera shown in FIG. 9, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied not only to display sections of these electronic apparatuses but also to any other form of apparatus which incorporates a display section.

Furthermore, the display devices incorporating the present invention are also suitable for use as a screen-type large area TV which is very thin, flexible and light. It is possible to paste such large area TV on a wall, or to hang on a wall. The flexible TV can be rolled up when it is not used.

The foregoing description has been given by way of example only and it will be appreciated by a person skilled in the art that modifications can be made without departing from the scope of the present invention,

What is claimed is:

1. A comparator circuit comprising a pair of complementary thin film transistors serially coupled to provide an inverter and two capacitors, one side of each capacitor being operably coupled to a respective input terminal and the other side of each capacitor being connected in common to a node coupled to the gates of the transistors, and further comprising a switch coupled to the node, the switch being arranged to provide a voltage from the point of series connection of the transistors for storage in the capacitors to act as a bias voltage for voltages applied to the input terminals and thereby compensate any threshold voltage variation between the thin film transistors.

2. A comparator circuit as claimed in claim 1, comprising two further switches each selectively connecting a respective said other side of said capacitors between ground and the said respective input.

3. A comparator circuit as claimed in claim 2, wherein the switches are implemented by transistors.

4. A comparator circuit as claimed in claim 1, wherein the transistors are CMOS TFT transistors.

5. A comparator circuit as claimed in claim 1, further comprising an output stage with said output stage being selectively isolated or connected to said transistor pair by an output stage switch.

6. A comparator circuit as claimed in claim 5, fixer comprising a buffer connected between the output stage switch and the said transistor pair.

7. A comparator circuit as claimed in claim 2, wherein the switches are implemented by transistors.

8. A comparator circuit as claimed in claim 2, wherein the transistors are CMOS TFT transistors.

9. A comparator circuit as claimed in claim 3, wherein the transistors are CMOS TFT transistors.

10. A comparator circuit as claimed in claim 2, further comprising an output stage with said output stage being selectively isolated or connected to said transistor pair by an output stage switch.

11. A comparator circuit as claimed in claim 3, further comprising an output stage with said output stage being selectively isolated or connected to said transistor pair by an output stage switch.

12. A comparator circuit as claimed in claim 4, further comprising an output stage with said output stage being selectively isolated or connected to said transistor pair by an output stage switch.

13. A method of comparing two input voltages by:

providing a comparator having a pair of complementary thin film transistors serially coupled to provide an inverter, and two capacitors, operably coupling one side of each capacitor to a respective input terminal and connecting in common the other side of each capacitor to a node coupled to the gates of the transistors, and further providing a switch coupled to the node, closing the switch to transfer a bias voltage to the node, storing the bias voltage on the capacitors so as to compensate any threshold voltage variation between the thin film transistors, opening the switch, applying each input voltage to a respective one of the capacitors, and detecting any resultant change in the bias voltage.

14. A method as claimed in claim 13, wherein the said one side of each capacitor is connected to a respective input terminal via a respective further switch, and wherein one of the tinker switches is closed and then opened in unison with closing the switch to transfer the bias voltage to the node and the other of the further switches is closed when the said one of the further switches and the switch are opened.

* * * * *